United States Patent
Wang

(10) Patent No.: US 11,245,084 B2
(45) Date of Patent: Feb. 8, 2022

(54) ELECTROLUMINESCENT DEVICE AND METHOD OF MANUFACTURING SAME, AND ELECTRONIC DEVICE

(71) Applicant: WUHAN CHINA STAR OPTOELECTRONICS SEMICONDUCTOR DISPLAY TECHNOLOGY CO., LTD., Hubei (CN)

(72) Inventor: Yamin Wang, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 124 days.

(21) Appl. No.: 16/613,436

(22) PCT Filed: Sep. 18, 2019

(86) PCT No.: PCT/CN2019/106372
§ 371 (c)(1),
(2) Date: Nov. 14, 2019

(87) PCT Pub. No.: WO2020/252953
PCT Pub. Date: Dec. 24, 2020

(65) Prior Publication Data
US 2020/0403175 A1    Dec. 24, 2020

(30) Foreign Application Priority Data
Jun. 20, 2019  (CN) .......................... 201910534879.0

(51) Int. Cl.
*H01L 51/50* (2006.01)
*H01L 51/52* (2006.01)
*H01L 51/00* (2006.01)

(52) U.S. Cl.
CPC ...... *H01L 51/5024* (2013.01); *H01L 51/0011* (2013.01); *H01L 51/5278* (2013.01)

(58) Field of Classification Search
CPC ............. H01L 51/5024; H01L 51/0011; H01L 51/5278; H01L 51/5088; H01L 51/002; H01L 51/0072
See application file for complete search history.

(56) References Cited

U.S. PATENT DOCUMENTS

| 2016/0155946 A1 | 6/2016 | Blouin et al. |
| 2019/0206309 A1 | 7/2019 | Sun et al. |
| 2019/0280233 A1* | 9/2019 | Kim .................... H01L 51/0039 |

FOREIGN PATENT DOCUMENTS

| CN | 105324460 A | 2/2016 |
| CN | 108231849 A | 6/2018 |

OTHER PUBLICATIONS

Junna Liu Enhanced Electroluminescent Efficiency with Graphene-Oxide Hole-Injecting Layer being doped by Conjugated Ionic Compounds.

* cited by examiner

*Primary Examiner* — Catherine S Branch
(74) *Attorney, Agent, or Firm* — Mark M. Friedman

(57) ABSTRACT

An electroluminescent (EL) device and a method of manufacturing same, and an electronic device. The EL device includes a first electrode, a second electrode, and a functional structural layer disposed between the first electrode and the second electrode. The functional structural layer includes a doping material and a graphene oxide material, and the doping material includes a plurality of conjugated ions.

6 Claims, 3 Drawing Sheets

ELECTROLUMINESCENT DEVICE AND METHOD OF MANUFACTURING SAME, AND ELECTRONIC DEVICE

FIELD OF INVENTION

The present invention relates to a field of display and, more particular, to an electroluminescent device and a method of manufacturing same, and an electronic device.

BACKGROUND OF INVENTION

Electroluminescent devices are self-luminous devices. Excitons are formed by combination and transfer of charge carriers between each functional layer. The electroluminescent devices emit light by using high efficiency organic compounds or metal complexes and are exceptional in terms of self-lumination brightness, efficiency, contrast, response times, and alike.

When graphene is oxidized, sp2 hybridization of the graphene will be destroyed. π electrons that can move freely are lost from a graphene oxide material, thereby making the graphene oxide material almost insulated. The graphene oxide material also has a wide bandgap larger than 3.5 ev.

Ionic bond is a very strong ion pair. Strength of ionic bonds between a cation and an anion will be reduced because of a conjugated effect. When a compound having conjugated ions combines with the graphene oxide material, the graphene oxide material can be reduced. π electrons that can move freely are formed in a conjugated region. Insulation and conductive performance of the graphene oxide material can be adjusted by the π electrons, which is a goal desired to be achieved.

SUMMARY OF INVENTION

To achieve the above goal, the present invention provides an electroluminescent device and a method of manufacturing same, and an electronic device. A doping material having conjugated ions is doped into a graphene oxide material to manufacture functional structural layer, thereby enhancing performance of the functional structural layer, especially enhancing a hole injection layer's ability to inject charge carriers. As a result, photoelectric performance of a luminescent device can be improved.

To achieve the above goal, a technical solution is provided. The present invention provides an electroluminescent (EL) device including: a first electrode, a second electrode, and a functional structural layer disposed between the first electrode and the second electrode. The functional structural layer includes a doping material and a graphite oxide material. The doping material includes a plurality of conjugated ions.

In an embodiment of the present invention, the functional structural layer includes a hole injection layer disposed on the first electrode. Material of the hole injection layer includes the doping material and the graphite oxide material. The doping material the conjugated ions. The functional structural layer further includes a hole transport layer disposed on the hole injection layer, a luminescent layer disposed on the hole transport layer, an electron transport layer disposed on the luminescent layer, an electron injection layer disposed on the electron transport layer, and the second electrode disposed on the electron injection layer.

In an embodiment of the present invention, material of the hole transport layer includes at least one of tetraphenyl biphenyl diamine, biphenyl diester, or N,N'-bis(1-naphthyl)-N,N'-diphenyl-1,1'-biphenyl-4-4'-diamine.

In an embodiment of the present invention, the doping material is N,N dimethyl diazoxide nitrate. A weight ratio of the doping material to the graphite oxide material ranges from 1:1 to 1:99.

In an embodiment of the present invention, the N,N dimethyl diazoxide nitrate includes at least one of the following structural formulas:

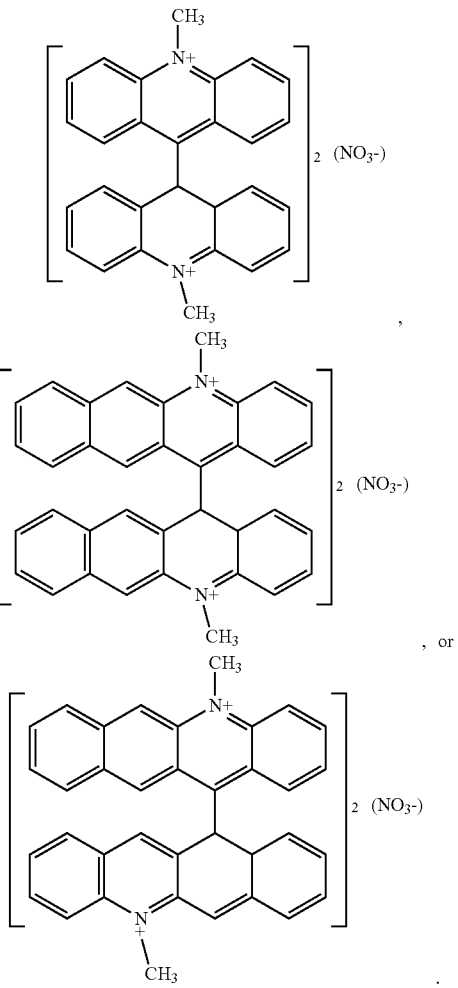

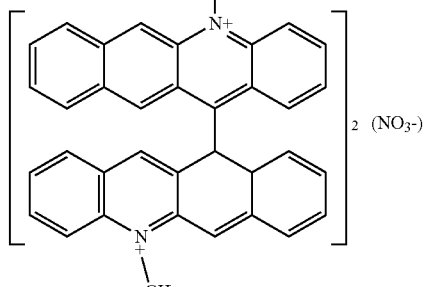

, or

The present invention further provides a method of manufacturing the above electroluminescent (EL) device, including the following steps: providing a conductive glass, wherein a surface of the conductive glass includes the first electrode; forming the functional structural layer on the surface of the conductive glass including the first electrode, wherein the functional structural layer includes the doping material and the graphite oxide material, and the doping material includes a plurality of conjugated ions; and forming the second electrode on a side of the functional structural layer away from the first electrode by vacuum evaporation.

In an embodiment of the present invention, the step of providing the conductive glass includes: cleaning the conductive glass by deionized water; cleaning the conductive glass by warm water for 30 to 50 minutes, wherein temperatures of the warm water range from 15 to 35 degrees Celsius; drying the conductive glass; and cleaning the conductive glass by a plasma cleaner for 6 to 15 minutes.

In an embodiment of the present invention, the step of forming the functional structural layer includes: providing the doping material and the graphite oxide material; dissolving the doping material in deionized water to obtain a solution of the doping material; dissolving the graphite oxide material in deionized water, and then vibrating the deionized water containing the graphite oxide material by ultrasonic waves to obtain a solution of the graphite oxide material; doping the solution of doping material with the solution of graphite oxide material to obtain the doping solution, dispersing the doping solution by ultrasonic waves for 2 to 4 hours at temperatures ranging from 30 to 50 degrees Celsius to obtain a mixing solution, wherein the mixing solution includes 0.1% to 50% by weight of the doping material; and coating the mixing solution on the surface of the conductive glass including the first electrode to form the hole injection layer.

In an embodiment of the present invention, the step of forming the functional structural layer further includes: fixing the conductive glass on a mask after the hole injection layer is formed; placing the mask in a vacuum evaporation chamber, and then vacuuming the vacuum evaporation chamber by using a molecular pump until a vacuum degree of the vacuum evaporation chamber is in the range from 4.0×10−4 to 6.5×10−4 Pa; and sequentially forming the hole transport layer, the luminescent layer, the electron transport layer, and the electron injection on the hole injection layer by vacuum evaporation.

The present invention further provides an electronic device including the above electroluminescent (EL) device.

The present invention provides an EL device and a method of manufacturing same, and an electronic device. Different levels of redox potentials of graphene oxide make different conductive abilities of the graphene oxide. According to a property of conjugated ionic compounds, a conjugated ionic compound having an aromatic ring is doped with a graphene oxide material to grafted onto a surface of the graphene oxide material by π-π stacking. The graphene oxide material is negatively charged after hydrolysis, so cations in the conjugated ionic compound form an electrostatic interaction with it. Therefore, an anion-cation interaction of the ionic compound is further reduced. After a doping process, anions and cations will be accelerated in a certain direction when a voltage is applied to the EL device. This is because that doped conjugated ions enhance a hole injection layer's ability to inject charge carriers. Photoelectric performance of the luminescent device is improved. According to a research of the present invention, conjugated ionic compound doped graphene oxide material is also likely to be used in a hole injection layer, which offers a prospect of an application of the conjugated ionic compound doped graphene oxide material.

DESCRIPTION OF DRAWINGS

The accompanying figures to be used in the description of embodiments of the present disclosure or prior art will be described in brief to more clearly illustrate the technical solutions of the embodiments or the prior art. Apparently, the accompanying figures described below are only part of the embodiments of the present disclosure, from which figures those skilled in the art can derive further figures without making any inventive efforts.

The present invention is further illustrated below in conjunction with the drawings and embodiments.

DETAILED DESCRIPTION OF PREFERRED EMBODIMENTS

Figure 1:
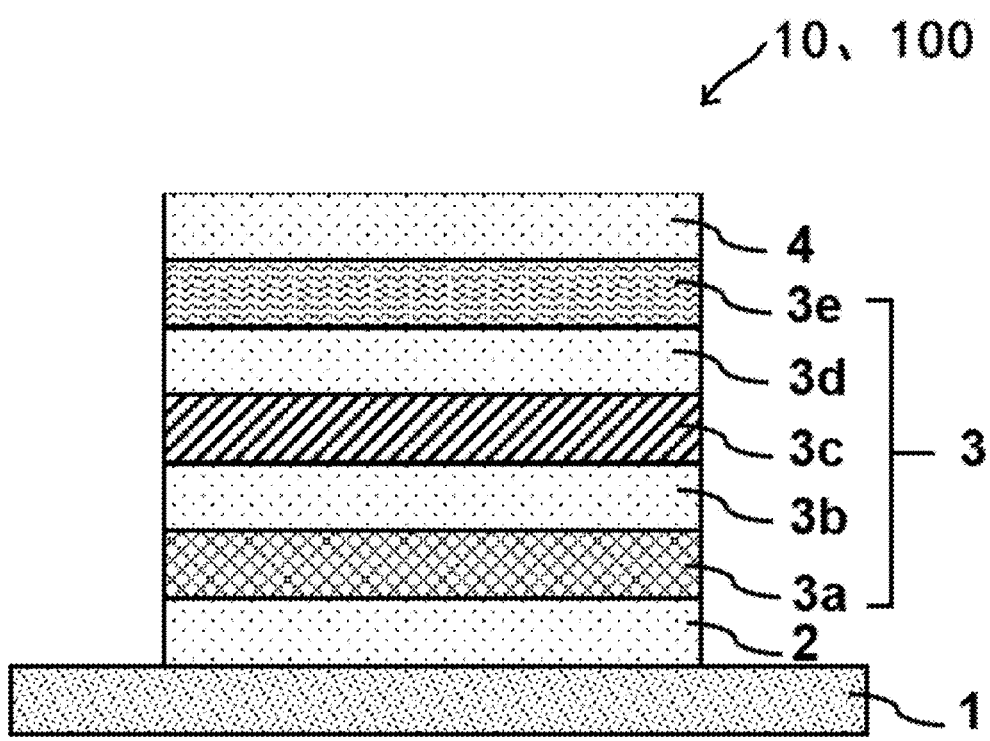
FIG. 1 is a structural diagram of an electroluminescent (EL) device according to an embodiment of the present invention.

The embodiments of the present disclosure are described in detail hereinafter. Examples of the described embodiments are given in the accompanying drawings, wherein the identical or similar reference numerals constantly denote the identical or similar elements or elements having the identical or similar functions. The specific embodiments described with reference to the attached drawings are all exemplary and are intended to illustrate and interpret the present disclosure, which shall not be construed as causing limitations to the present disclosure.

The description of the following embodiments refers to the accompanying drawings, which is intended to prove that the invention can be implemented. In the description of the present disclosure, it should be understood that directional terms such as "upper," "lower," "front," "rear," "left," "right," "top," "bottom," as well as derivative thereof are for convenience of description, but do not for limiting the present invention.

As shown in FIG. 1, in an embodiment of the present invention, an electroluminescent (EL) device 10 provided by the present invention includes a conductive glass 1, a first electrode 2, a functional structural layer 3, and a second electrode 4.

The first electrode 2 is disposed on a side of the conductive glass 1. The first electrode 2 is an anode. The functional structural layer 3 includes a hole injection 3a, a hole transport layer 3b, and a luminescent layer 3c. The hole injection layer 3a is disposed on the first electrode 2. The hole transport layer 3b is disposed on the hole injection layer 3a. The luminescent layer 3c is disposed on the hole transport layer 3b. The second electrode 4 is directly disposed on the luminescent layer 3c. The second electrode 4 is a cathode.

The functional structural layer 3 includes a doping material and a graphene oxide material. The doping material includes a plurality of conjugated ions. Specifically, material of the hole injection layer 3a is the doping material and the graphene oxide material. A weight ratio of the doping material to the graphene oxide material ranges from 1:1 to 1:99 in the hole injection layer 3a. In the present embodiment, a conjugated ionic compound having an aromatic ring is doped with graphene oxide material to grafted onto a surface of the graphene oxide material by π-π stacking. The graphene oxide is material negatively charged after hydrolysis, so cations in the conjugated ionic compound form an electrostatic interaction with it. Therefore, an anion-cation interaction of the ionic compound is further reduced. After a doping process, anions and cations will be accelerated in a certain direction when a voltage is applied to the EL device. This is because that doped conjugated ions enhance a hole injection layer 3a's ability to inject charge carriers. Photoelectric performance of a luminescent device is improved.

To more clearly illustrate the doping material, in the present embodiment, the doping material is N,N dimethyl diazoxide nitrate including at least one of the following structural formulas:

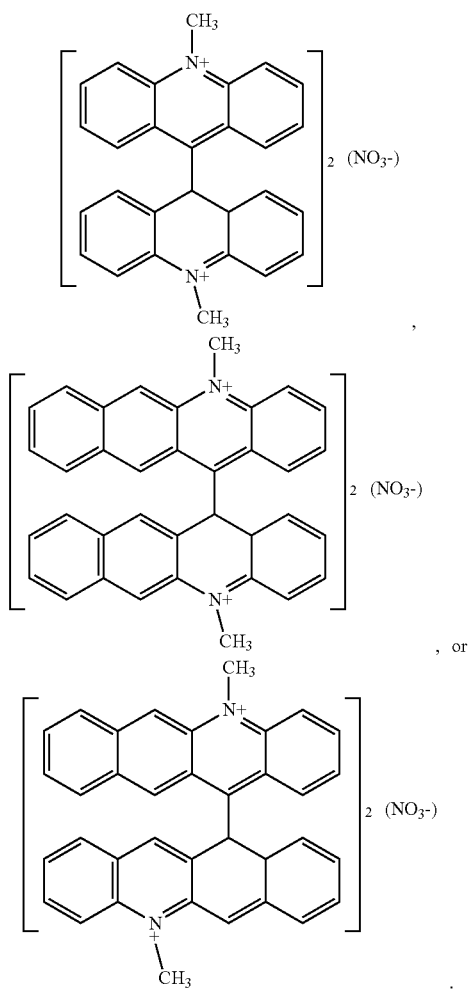

Structural formula of the graphene oxide material is represented as follows:

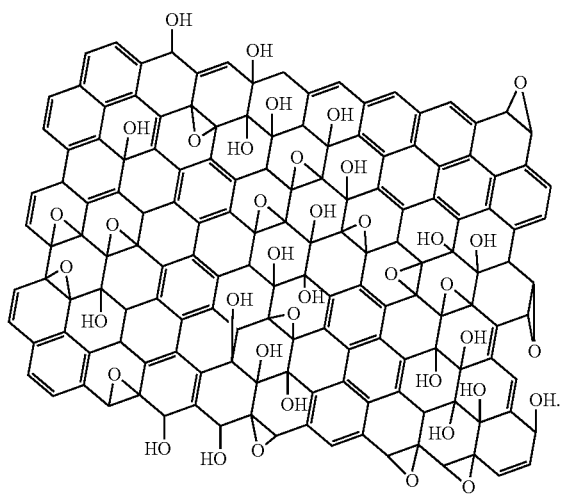

Material of the hole transport layer 3b includes at least one of tetraphenyl biphenyl diamine, biphenyl diester, or N,N'-bis(1-naphthyl)-N,N'-diphenyl-1,1'-biphenyl-4-4'-diamine.

In the present embodiment, the functional structural layer 3 can further include an electron transport layer 3d and an electron injection layer 3e. The electron transport layer 3d is disposed on the luminescent layer 3c. The electron injection layer 3e is disposed on the electron transport layer 3d. The second electrode 4 is disposed on the electron injection layer 3e.

In the present embodiment, the functional structural layer 3 can further include an electron blocking layer (not shown) disposed between the first electrode 2 and the second electrode 4. For example, the electron blocking layer can be disposed between the luminescent layer 3c and the hole transport layer 3b. As a result, the electron blocking layer can prevent electrons leaking from the luminescent layer 3c when current flows through the luminescent device.

In the present embodiment, the functional structural layer 3 can further include a hole blocking layer (not shown) disposed between the first electrode 2 and the second electrode 4. For example, the hole blocking layer can be disposed between the electron transport layer 3d and the luminescent layer 3c. As a result, the hole blocking layer can confine charge carriers and excitons in the luminescent layer 3c when current flows through the luminescent device.

Because the anode can easily inject holes into the hole injection layer 3a, the hole transport layer 3b, or directly into the luminescent layer 3c. The absolute value of the difference between the work function of the anode and highest occupied molecular orbital (HOMO) level or valence band level of any one of luminescent material of the luminescent layer 3c or p-type semiconductor material of the hole injection layer 3a, hole transport layer 3b, or the electron blocking layer is less than 0.5 ev, preferably less than 0.2 ev.

Material of the anode can be a conductive metal, a metal oxide, or a conductive polymer. For example, material of the anode can be Al, Cu, Ag, Mg, Fe, Co, Ni, Mo, Pd, Pt, indium tin oxide (ITO), or Al doped zinc oxide. Other appropriate materials, which those skilled in the art can easily come up with, of the anode are known. The anode material can be deposited by any appropriate technique like physical vapor deposition including radio frequency (RF) magnetron sputtering, vacuum deposition with steam, and electron beam (e-beam) deposition. The anode is patterned and structured. A patterned ITO conductive glass 1 can be bought from the market and can be used for manufacturing a device of the present invention.

The cathode can be a conductive metal, a metal oxide, or a conductive polymer. In principle, any appropriate material of the cathode of the electroluminescent device 10 may be used in the present invention. For example, material of the cathode can be Al, Au, Ag, Ca, Ba, Mg, LiF and Al, Mg—Al alloy, $BaF_2$ and Al, Cu, Fe, Co, Ni, Mo, Ba, Pt, and ITO. The cathode can easily inject electrons into the electron injection layer 3e, the electron transport layer 3d, or directly into the luminescent layer 3c. In one embodiment, the absolute value of the difference between the work function of the cathode and lowest occupied molecular orbital (LUMO) level or valence band level of any one of luminescent material of the luminescent layer 3c or n-type semiconductor material of the electron injection layer 3e, electron transport layer 3d, or the hole blocking layer is less than 0.5 ev, preferably less than 0.2 ev. The cathode material can be deposited by any appropriate technique like physical vapor deposition including RF magnetron sputtering, vacuum deposition with steam, and electron beam (e-beam) deposition.

The luminescent layer 3c is an organic light-emitting layer doped with organic light-emitting material. The organic light-emitting material is a material that emitted light from their singlet states, a material that emitted light from their triplet states, or a thermally activated delayed fluorescence (TADF) material.

First Method Embodiment

The present invention further provides a method of manufacturing the EL device 10, including a step of: providing the conductive glass 1 with the first electrode 2 disposed on a surface of the conductive glass 1.

Specifically, the step of providing the conductive glass 1 with the first electrode 2 disposed on a surface of the conductive glass 1 includes a plurality of steps of: cleaning the conductive glass 1 by deionized water; cleaning the conductive glass 1 by warm water for 30 to 50 minutes, and then drying the conductive glass 1, wherein temperatures of the warm water range from 15 to 35 degrees Celsius; cleaning the conductive glass 1 by a plasma cleaner for 6 to 15 minutes. A work function of a surface of the first electrode 2 can be increased to 4 to 8 ev, and contact area of the first electrode 2 and the functional structural layer 3 is increased.

The method of manufacturing the electroluminescent device 10 further includes a step of: forming the functional structural layer 3 on the surface, which the first electrode 2 is disposed on, of the conductive glass 1.

Specifically, the step of forming the functional structural layer 3 on the surface, which the first electrode 2 is disposed on, of the conductive glass 1 includes a plurality of steps of: providing the doping material and the graphene oxide material; dissolving the doping material in deionized water to obtain a solution of the doping material; dissolving the graphene oxide material in an deionized water, and then vibrating the deionized water by ultrasonic waves to obtain a solution of the graphene oxide material. In the present embodiment, concentration of the graphene oxide material is 0.5 mg/ml. In the step of manufacturing the solution of the graphene oxide material, the concentration of the graphene oxide material can be adjusted by ultraviolet light (UV) reduction.

The step of forming the functional structural layer 3 on the surface, which the first electrode 2 is disposed on, of the conductive glass 1 further includes a plurality of steps of: doping the solution of the doping material with the solution of the graphene oxide material to obtain a doping solution, and then dispersing the doping solution by ultrasonic waves for 2 to 4 hours at temperatures ranging from 30 to 50 degrees Celsius to obtain a mixing solution. The mixing solution includes 10% by weight of the doping material. The mixing solution is coated onto the surface, which the first electrode 2 is disposed on, of the conductive glass 1 to form the hole injection layer 3a.

After forming the hole injection layer 3a, fixing the conductive glass 1 on a mask, and placing the mask in a vacuum evaporation chamber which is vacuumed by a molecular pump until a vacuum degree of the vacuum evaporation chamber is in the range from $4.0 \times 10^{-4}$ to $6.5 \times 10^{-4}$ Pa. Depositing at least one of tetraphenyl biphenyl diamine, biphenyl diester, or N,N'-bis(1-naphthyl)-N,N'-diphenyl-1,1'-biphenyl-4-4'-diamine on the hole injection layer 3a to form the hole transport layer 3b.

After forming the hole transport layer 3b, sequentially forming the luminescent layer 3c, the electron transport layer 3d, and the electron injection layer 3e. Material of the luminescent layer 3c can be tris(8-hydroxyquinoline)aluminum. Material of the electron injection layer is LiF. A deposition rate of the organic material and tris(8-hydroxyquinoline)aluminum used in the organic transport 3b is 1 to 4 Å/s. A deposition rate of the LiF is 0.1 to 0.3 Å/s.

After forming the functional structural layer 3, forming the second electrode 4 on the functional structural layer 3. In the present embodiment, material of the second electrode 4 is Al. A deposition rate of the Al is 1 to 5 Å/s. Finally, the EL device 10 is formed.

Second Method Embodiment

Difference between the present embodiment and the first method embodiment is that the mixing solution includes 20% by weight of the doping material in the present embodiment.

Third Method Embodiment

Difference between the present embodiment and the first method embodiment is that the mixing solution includes 30% by weight of the doping material in the present embodiment.

Fourth Method Embodiment

Difference between the present embodiment and the first method embodiment is that the mixing solution includes 40% by weight of the doping material in the present embodiment.

Fifth Method Embodiment

Difference between the present embodiment and the first method embodiment is that the mixing solution includes 50% by weight of the doping material in the present embodiment.

First Comparative Example

Difference between the first comparative example and the first method embodiment is that material of the hole injection layer 3a is a solution of the graphene oxide material without doping the doping material containing conjugated ions.

In other embodiments, the mixing solution can also include 0.1% or 1% by weight of the doping material. In order to facilitate comparative performance, the present invention detects electroluminescence properties of the EL devices provided by the first to fifth embodiments.

Figure 2:
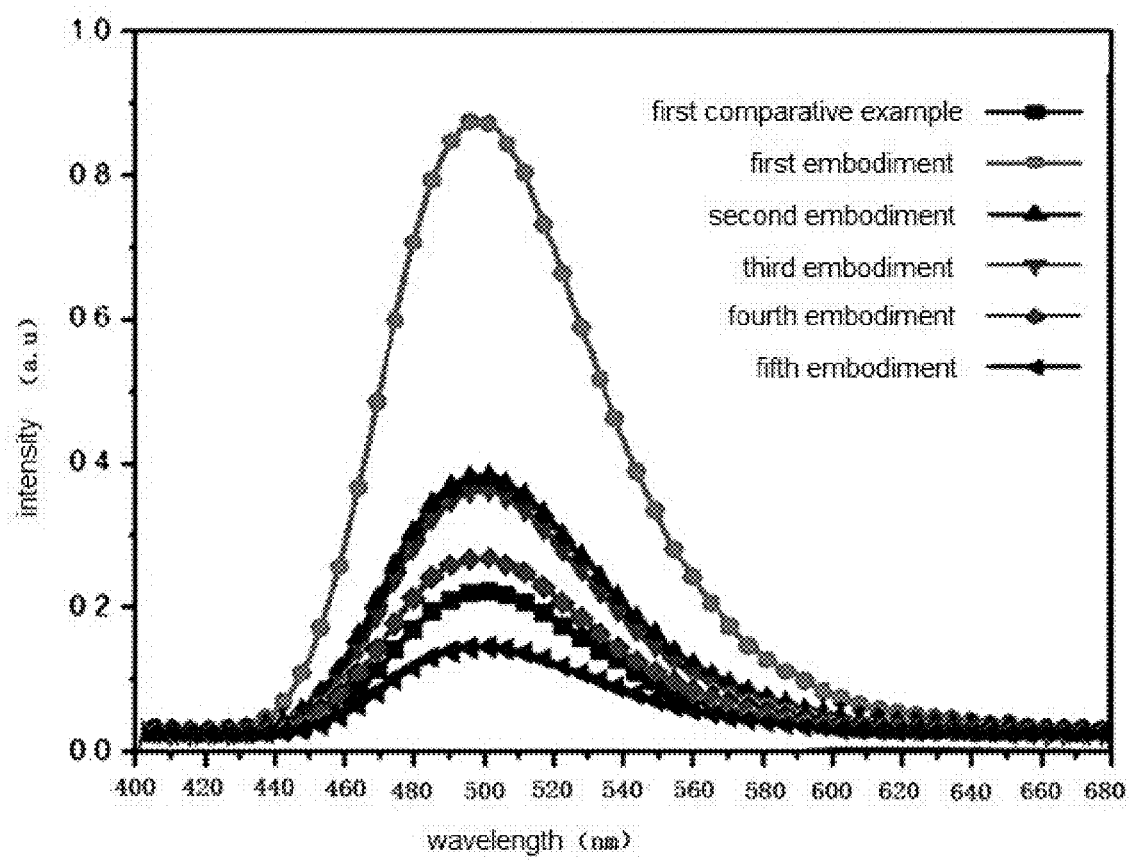
FIG. 2 is an electroluminescence spectrum of EL devices according to a first to fifth method embodiments and a first comparative example of the present invention.

As shown in FIG. 2, peak of photoemission spectra of the EL devices provided by the first comparative example and the first to fifth method embodiments are at about 500 nm. This indicates that concentration of the graphene oxide material doesn't have significant influences on a position of a peak of photoemission spectra of the electroluminescent devices when material of the luminescent layer 3c is tris(8-hydroxyquinoline)aluminum.

Figure 3:
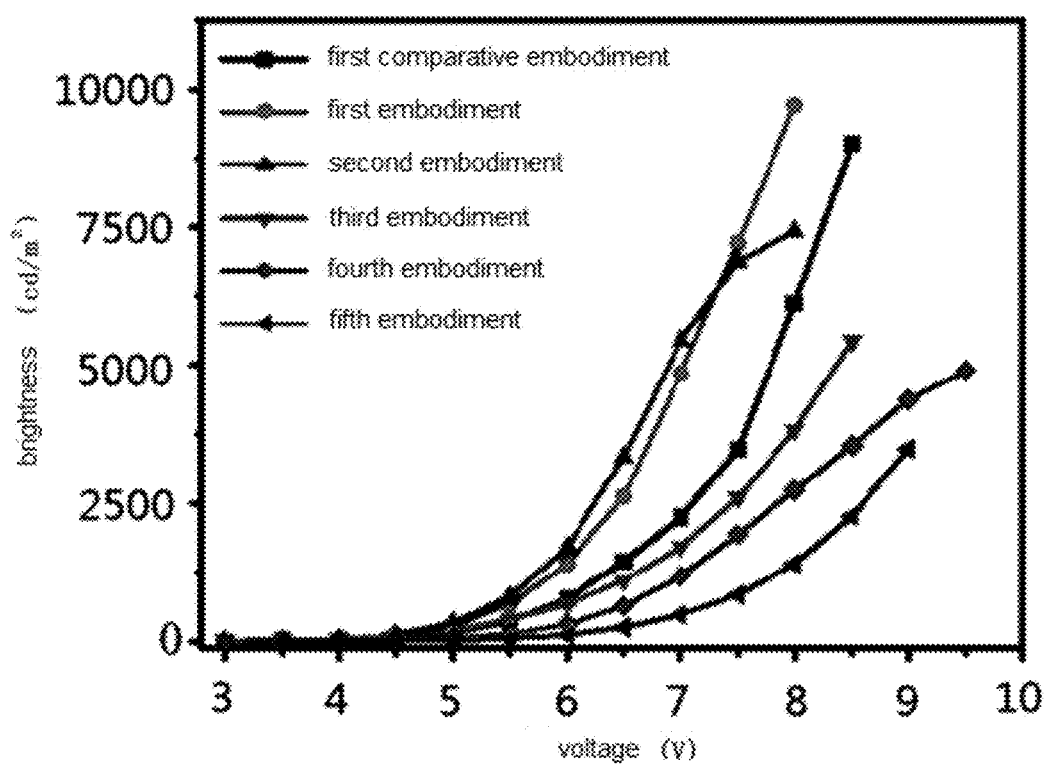
FIG. 3 is a brightness versus voltage diagram of EL devices according to a first to fifth method embodiments and a first comparative example of the present invention.

As shown in FIG. 3, concentration of conjugated ions in the mixing solution will affect hole injection ability when other functional layers remain unchanged. That is, concentration of the doping material in the mixing solution affects hole injection ability. In a range that a concentration of the doping material is less than or equal to 20% by weight, the higher the concentration of the doping material is, the higher the luminous ability of the electroluminescent device is. However, when the concentration of the doping material is more than 20%, the conjugated ions will be too much. When a voltage is more than 7.5V, brightness of the EL devices begin to decrease due to the increase of current density, which is caused by the increase of hole injection ability. However, electron injection ability is not increased, thereby increasing number of nonradiative recombination in the EL device, and decreasing the brightness of the EL device.

As shown in FIG. 1, the present invention further provides an electronic device 100 including the EL device 10. The main design point of the present invention is the EL device 10, so other structures will not be described here. The electronic device 100 provided by the present invention includes display devices, luminous devices, light sources, sensors, and alike.

The above are only preferred embodiments of the present invention, which are is not intended to limit the present disclosure. It is understood that many changes and modifications to the described embodiment can be carried out without departing from the scope and the spirit of the disclosure that is intended to be limited only by the appended claims.

What is claimed is:

1. An electroluminescent (EL) device, comprising:
   a first electrode;
   a second electrode; and
   a functional structural layer disposed between the first electrode and the second electrode;
   wherein the functional structural layer comprises a doping material and a graphite oxide material; and
   wherein the doping material is N,N dimethyl diazoxide nitrate and comprises a plurality of conjugated ions.

2. The EL device of claim 1, wherein the functional structural layer comprises:
   a hole injection layer disposed on the first electrode;
   wherein material of the hole injection layer comprises the doping material and the graphite oxide material; and
   wherein the doping material comprises the conjugated ions;
   a hole transport layer disposed on the hole injection layer;
   a luminescent layer disposed on the hole transport layer;
   an electron transport layer disposed on the luminescent layer;
   an electron injection layer disposed on the electron transport layer; and
   the second electrode disposed on the electron injection layer.

3. The EL device of claim 2, wherein material of the hole transport layer comprises at least one of tetraphenyl biphenyl diamine, biphenyl diester, or N,N'-bis(1-naphthyl)-N,N'-diphenyl-1,1'-biphenyl-4-4'-diamine.

4. The EL device of claim 1,
   wherein a weight ratio of the doping material to the graphite oxide material ranges from 1:1 to 1:99.

5. The EL device of claim 4, wherein the N,N dimethyl diazoxide nitrate comprises at least one of the following structural formulas:

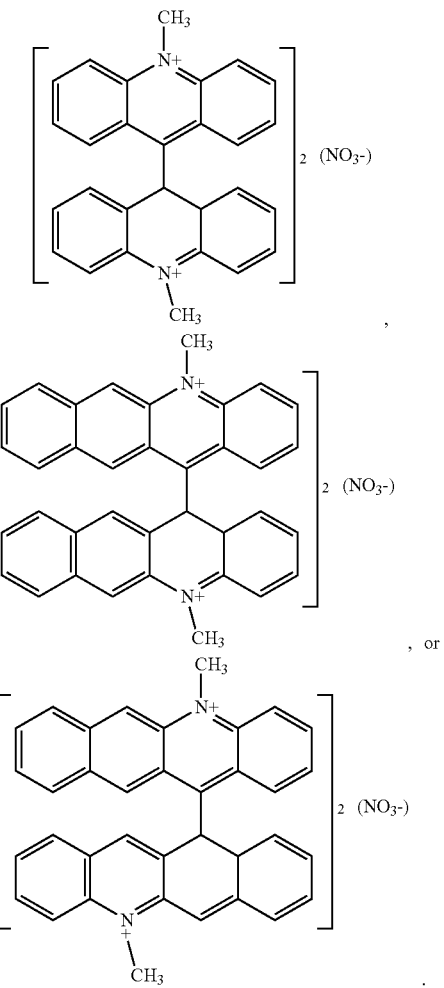

6. An electronic device, comprising the electroluminescent (EL) device of claim 1.

* * * * *